United States Patent
Kim et al.

(10) Patent No.: US 9,437,696 B2
(45) Date of Patent: Sep. 6, 2016

(54) SEMICONDUCTOR DEVICE AND METHOD FOR FABRICATING THE SAME

(71) Applicant: SK hynix Inc., Gyeonggi-do (KR)

(72) Inventors: Ji-In Kim, Gyeonggi-do (KR); Do-Youn Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/056,697

(22) Filed: Oct. 17, 2013

(65) Prior Publication Data
US 2014/0353743 A1    Dec. 4, 2014

(30) Foreign Application Priority Data

May 31, 2013    (KR) .................. 10-2013-0063000

(51) Int. Cl.
| | |
|---|---|
| *H01L 21/8238* | (2006.01) |
| *H01L 29/423* | (2006.01) |
| *H01L 21/762* | (2006.01) |
| *H01L 27/108* | (2006.01) |
| *H01L 21/76* | (2006.01) |

(52) U.S. Cl.
CPC ..... *H01L 29/4236* (2013.01); *H01L 21/76229* (2013.01); *H01L 21/823814* (2013.01); *H01L 21/823878* (2013.01); *H01L 27/10876* (2013.01); *H01L 21/76* (2013.01)

(58) Field of Classification Search
CPC ............. H01L 21/76; H01L 21/76229; H01L 21/823807; H01L 21/823814; H01L 21/823878; H01L 27/10876
See application file for complete search history.

(56) References Cited

U.S. PATENT DOCUMENTS

| | | | |
|---|---|---|---|
| 2005/0162927 A1* | 7/2005 | Chien et al. | 365/185.28 |
| 2006/0105529 A1* | 5/2006 | Lee | 438/283 |
| 2007/0057312 A1* | 3/2007 | Kim | 257/315 |
| 2007/0090443 A1* | 4/2007 | Choi | H01L 21/84 257/314 |
| 2009/0035916 A1* | 2/2009 | Kim | H01L 21/31116 438/424 |
| 2009/0057751 A1* | 3/2009 | Ariyoshi | H01L 21/28273 257/321 |
| 2010/0015775 A1* | 1/2010 | Lee et al. | 438/400 |
| 2010/0159683 A1* | 6/2010 | Lee | H01L 21/28123 438/585 |
| 2010/0255654 A1* | 10/2010 | Lin | H01L 21/76232 438/424 |
| 2011/0156135 A1* | 6/2011 | Yoon et al. | 257/330 |
| 2011/0220993 A1* | 9/2011 | Im | 257/330 |

FOREIGN PATENT DOCUMENTS

| | | |
|---|---|---|
| KR | 100798774 | 1/2008 |
| KR | 1020080036356 | 4/2008 |

\* cited by examiner

*Primary Examiner* — Su C Kim
(74) *Attorney, Agent, or Firm* — IP & T Group LLP

(57) ABSTRACT

A semiconductor device includes a substrate having an element isolation region, a trench formed on the element isolation region, a gate electrode buried in the trench, and a plurality of active regions formed on both ends of the gate electrode, wherein a pin is formed under the gate electrode between the active regions.

15 Claims, 11 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2013-0063000, filed on May 31, 2013, which is incorporated herein by reference in its entirety.

BACKGROUND

1. Field

Exemplary embodiments of the present invention relate to a semiconductor device and a method for fabricating the same, and more particularly, a semiconductor device and a method for fabricating the same having a buried gate electrode.

2. Description of the Related Art

In a conventional gate structure, a plurality of gates are formed on a substrate, and a landing plug contact is formed between the gates and is coupled to a source/drain. A storage node contact is formed on the landing plug contact and couples a capacitor to the substrate.

Recently, as a semiconductor device has been minimized, a gate is not formed on a substrate, and a buried gate structure is proposed. That is, a gate is buried in a trench after forming the trench by etching the substrate.

SUMMARY

Exemplary embodiments of the present invention are directed to a semiconductor device and a method for fabricating the same, which reduce an overlap area between a passing gate and an adjacent cell.

Exemplary embodiments of the present invention are directed to a semiconductor device and a method for fabricating the same, which improve a row hammering and a gate induced drain leakage (GIDL).

In accordance with an exemplary embodiment of the present invention, a semiconductor device includes a substrate including an element isolation region, a trench formed in the element isolation region, a gate electrode buried in the trench, and a plurality of active regions formed on the gate electrode, wherein a fin is formed on the gate electrode between two adjacent active regions.

In accordance with another exemplary embodiment of the present invention, a semiconductor device includes a substrate having an element isolation region, a trench formed in the element isolation region, a gate electrode buried in the trench, and a plurality of active regions formed on the gate electrode, wherein the element isolation region is formed on the gate electrode and includes a fin formed on the gate electrode between two adjacent active regions.

In accordance with still another exemplary embodiment of the present invention, a semiconductor device includes a substrate having an element isolation region, a first trench formed in the element isolation region, a first gate electrode buried in the first trench, a plurality of active regions formed on the first gate electrode, and a second trench formed in the element isolation region, in parallel with the first trench, and a second gate electrode buried in the second trench, wherein the element isolation region is formed on the first gate electrode between two adjacent active regions, and includes a fin formed protrudedly on a bottom surface of the first trench.

In accordance with still another exemplary embodiment of the present invention, a semiconductor device includes a substrate having an element isolation region and an active region defined by the element isolation region; trenches formed on the active region and the element isolation region and a gate electrode buried in the trenches, wherein the trenches have a same depth on the active region and the element isolation region.

In accordance with still another exemplary embodiment of the present invention, a method for fabricating a semiconductor device includes forming an element isolation region on a substrate, forming a trench having a fin by etching the element isolation region, and forming a gate electrode that buries the trench.

Before the forming of the trench having the fin, the method further includes forming a hard mask pattern for blocking a region where a fin is formed.

The gate electrode includes a first region having a first thickness and a second region having a second thickness thicker than the first thickness, and the first region is formed on the fin.

In accordance with still another exemplary embodiment of the present invention, a method for fabricating a semiconductor device includes forming an element isolation region and a plurality of active regions defined by the element isolation region, on a substrate, forming a first trench having a fin by etching the element isolation region, forming a second trench having a planarized surface by etching the active regions, and forming a first gate electrode and a second gate electrode which bury the first trench and the second trench, respectively.

Before the forming of the first trench, the method further includes forming a first hard mask pattern for blocking a region where the fin is partially formed on the element isolation region.

In the forming of the first trench and the second trench, the first trench and the second trench are simultaneously formed using a single second mask pattern as an etching mask.

The second hard mask pattern has a line shape.

The first trench and the second trench have a same depth.

The first gate electrode includes a first region having a first thickness and a second region having a second thickness thicker than the first thickness, and the first region is formed on the fin.

The gate electrode includes a metal.

DETAILED DESCRIPTION

Figure 1:
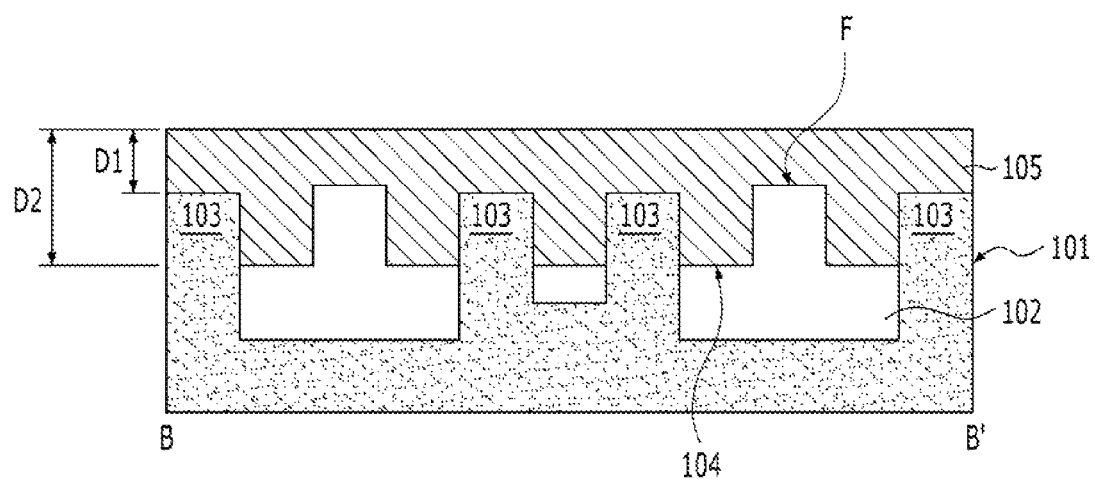
FIG. 1 is a cross-sectional view illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

In general, a buried gate of a line type is formed to be expanded toward a short axis direction of an active region. A trench is formed on an element isolation layer of a buried gate region by a mask of a line type. Herein, in case of an element isolation layer having an etching line width relatively wider than that of the short axis direction of the active region, a trench deeper than the active region may be formed by a loading effect.

A conducting material is buried in the trench formed on the element isolation layer during a buried gate forming process. A buried gate formed on the element isolation layer other than the active region is referred to as a passing gate. Herein, a bottom plane of the passing gate may be located lower than a bottom plane of the buried gate.

An interference between a passing gate and a neighboring cell has an influence on a device performance. Especially, according to a change of a design rule, a distance between the passing gate and the neighboring cell is shortened, and according as a bottom plane of the passing gate is located lower than a bottom plane of the buried gate, an overlap area between the passing gate and the neighboring cell is increased. Thus, a gate induced drain leakage (GIDL) caused by a potential difference between the passing gate and a cell data is deteriorated, and a row hammering issue occurs. To solve this concern, embodiments of the present invention provide a semiconductor device and a method for fabricating the same which minimizes an interference between a passing gate and a neighboring cell by forming a trench of the passing gate having a fin shape.

FIG. 1 is a cross-sectional view illustrating a semiconductor device in accordance with an embodiment of the present invention.

As shown in FIG. 1, a plurality of active region 103 is defined by forming an element isolation region 102 on a substrate 101. A trench 104 having a fin F is formed on the element isolation region 102. The fin F is formed higher than a bottom plane of the trench 104. The element isolation region 102 may include an insulating material.

A buried gate electrode 105 is formed to be buried in the trench 104. The buried gate electrode 105 may adjust an etching thickness to bury an entire surface of the trench 104 having the fin F. Although the buried gate electrode 105 is shown in FIG. 1 to bury an upper portion of the substrate 101, a surface of the buried gate electrode 105 may be formed lower than a surface of the substrate 101 excluding the buried gate region 105.

The buried gate electrode 105 may include a first region having a first thickness D1 and a second region having a second thickness D2 thicker than the first thickness D1 by the active region 103 and the fin F, and may be formed to have a bottom plane of an uneven shape having the first region and the second region. That is, a buried thickness of the buried gate electrode 105 on the fin F region, which is protruded higher than a bottom plane of the trench 104, may be thinner than those of other regions.

Since a buried thickness of the buried gate electrode 105 on the fin F region is decreased, an overlap area between the buried gate electrode 105 and a neighboring cell may be reduced during a post-process. Thus, a row hammering and a gate induced drain leakage (GIDL) are improved.

FIGS. 2A to 2F are plane views illustrating a method for fabricating a semiconductor device in accordance with an embodiment of the present invention. FIGS. 3A to 3F are cross-sectional views illustrating a method for a fabricating a semiconductor device, taken along A-A' line shown in FIGS. 2A to 2F. FIGS. 4A to 4F are cross-sectional views illustrating a method for a fabricating a semiconductor device, taken along B-B' line shown in FIGS. 2A to 2F. For the convenience of the descriptions, FIGS. 2A to 2F, FIGS. 3A to 3F and FIGS. 4A to 4F will be described together according to a process sequence.

Figure 2A:
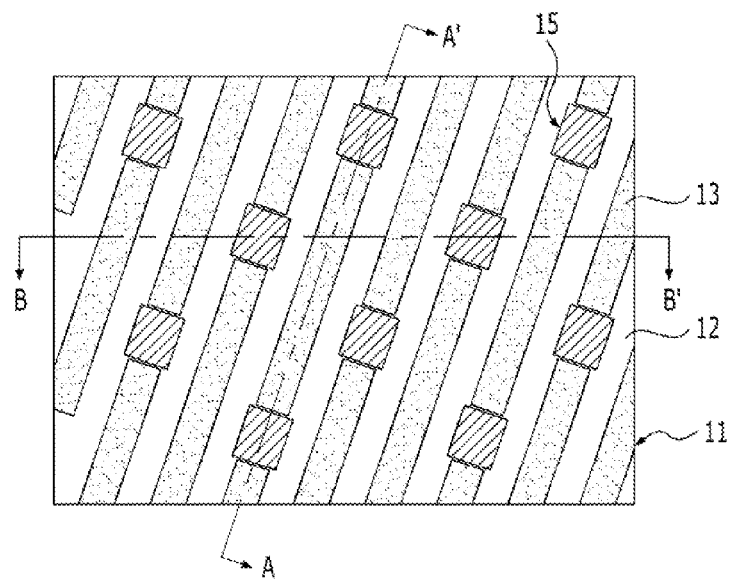
FIGS. 2A to 2F are plane views illustrating a method for fabricating a semiconductor device in accordance with an embodiment of the present invention.
Figure 3A:
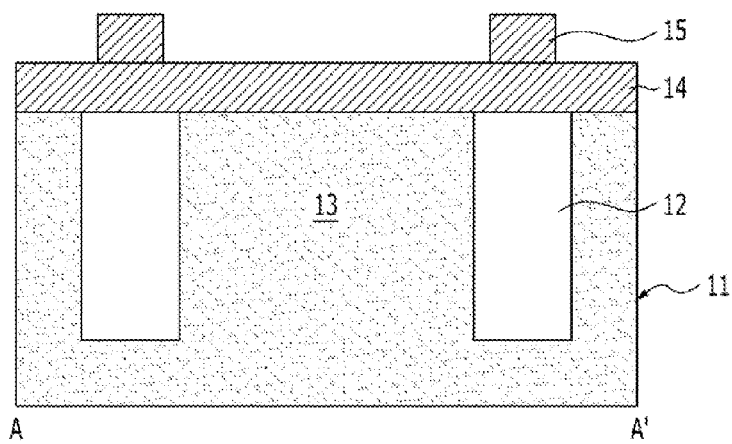
FIGS. 3A to 3F are cross-sectional views illustrating a method for fabricating a semiconductor device, taken along A-A' line shown in FIGS. 2A to 2F.
Figure 4A:
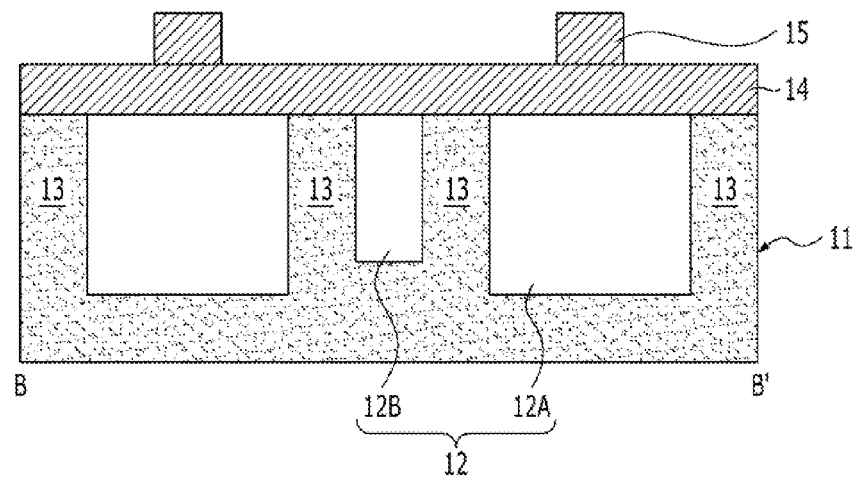
FIGS. 4A to 4F are cross-sectional views illustrating a method for a fabricating a semiconductor device, taken along B-B' line shown in FIGS. 2A to 2F.

As shown in FIGS. 2A, 3A and 4A, a plurality of active regions 13 are defined by forming an element isolation region 12 on a substrate 11. The substrate 11 may include a semiconductor substrate. The substrate 11 may include a silicon substrate, a silicon germanium substrate or a silicon-on-insulator (SOI) substrate.

The element isolation region 12 may be formed by a shallow trench isolation (STI) process. A wall oxide, a liner and a gap-fill material are sequentially formed on the element isolation region 12. The liner may include silicon nitride and silicon oxide. The silicon nitride may include $Si_3N_4$, and the silicon oxide may include $SiO_2$. The gap-fill material may include silicon oxide such as a spin-on-dielectric (SOD). The gap-fill material may include silicon nitride. Herein, the silicon nitride may be gap-filled using the silicon nitride used as the liner.

The active regions 13 defined by the element isolation region 12 may have a bar shape having a long axis and a short axis. In a long axis direction of the active regions 13, the active regions 13 may be formed to have a uniform interval, and the element isolation region 12 between the active regions 13 may be formed to have a uniform interval. In a short axis direction of the active regions 13, the active regions 13 may be formed to have an uniform interval, but the element isolation region 12 may be formed to have a narrow line width and a wide line width as shown in FIG. 4A. A first element isolation region 12A having the wide line width may be formed deeper than a second element isolation region 12B having the narrow line width due to a loading effect caused by a line width difference during forming of the element isolation region 12. That is, a trench may be formed to have a bottom plane of the first element isolation region 12A lower than that of the second element isolation region 12B.

Subsequently, a first hard mask layer 14 is formed on the substrate 11 having the element isolation region 12. The first hard mask layer 14 is used as an etch mask of the substrate 11 to form a buried gate in a post-process, and may be formed with a material having an etching selectivity. The first hard mask layer 14 may include an insulating material.

Subsequently, a second hard mask pattern 15 is formed on the first hard mask layer 14. The second hard mask pattern 15 is used in forming a fin on a passing gate, which is formed on the element isolation region 12, and may be patterned using a mask process for blocking an area where the fin is to be formed. The second hard mask pattern 15 may be locally formed on, for example, only the area where the fin is to be formed during a subsequent trench process. More specifically, the second hard mask pattern 15 may be formed on an upper part of the element isolation region 12 between the active regions 13 in the long axis direction as shown in FIG. 3A, and may be locally formed on a center of the first element isolation region 12A in the short axis direction as shown in FIG. 4A.

The mask process for forming the second hard mask pattern 15 may be performed using a cut-mask for isolating the active regions of the line type. In case of the cut-mask, for example, only a local portion is opened to separate the active regions of the line type to have a bar shape. But, in case that the cut-mask is applied using a negative photoresist layer, a mask process for blocking a local portion may be performed. Since a region where the second hard mask pattern 15 is formed is overlapped with a cut-mask region, if a patterning is performed using the cut-mask, a process margin may be acquired without performing an additional mask process.

The second hard mask pattern 15 may be formed with a same material as the first hard mask layer 14. The second hard mask pattern 15 may include an insulating material. For example, the insulating material may include silicon oxide. The silicon oxide may include tetra-ethyl-ortho-silicate (TEOS) oxide.

Figure 2B:
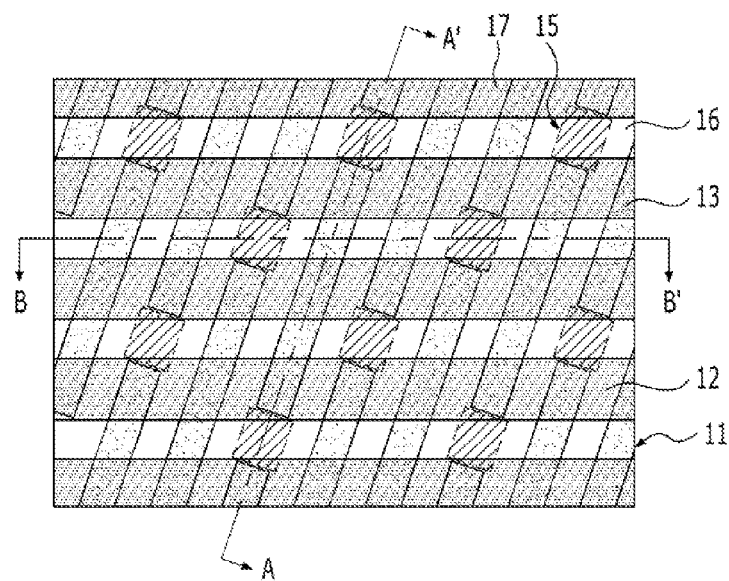
Figure 3B:
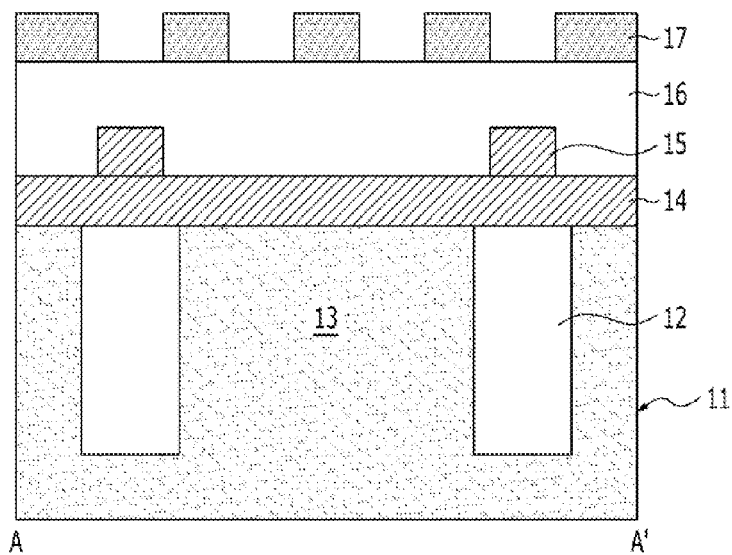
Figure 4B:
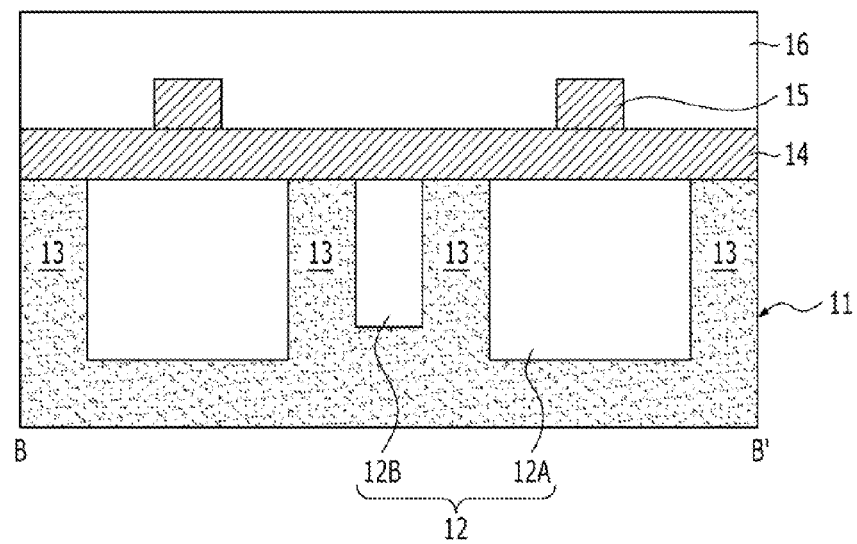

As shown in FIGS. 2B, 3B and 4B, a planarization layer 16 is formed on the first hard mask layer 14 and the second hard mask layer 15. The planarization layer 16 may work as an etching barrier of the first hard mask layer 14 and the second hard mask layer 15, and may implement a subsequent patterning easily by reducing a height difference between the first hard mask layer 14 and the second hard mask layer 15. Thus, a fluid membrane for reducing a height difference between the first hard mask layer 14 and the second hard mask layer 15, may be applied as the planarization layer 16. The planarization layer 16 may be formed with a material having an etching selectivity for the first hard mask layer 14 and the second hard mask layer 15. The planarization layer 16 may be formed with a spin-on-carbon (SOC) layer or a spin-on-dielectric (SD) layer and the like.

Next, a photoresist layer pattern 17 is formed on the planarization layer 16. An anti-reflective layer may further formed on the planarization layer 16 before forming the photoresist layer pattern 17. The photoresist layer pattern 17 of a line type may be formed to be extended toward to a short axis direction of the active region. The photoresist layer pattern 17 may be patterning with a line and spacer type, which defines a buried gate region. Since a cross sectional view of FIG. 4B shows a buried gate region, the photoresist layer pattern 17 is not shown in FIG. 4B.

Figure 2C:
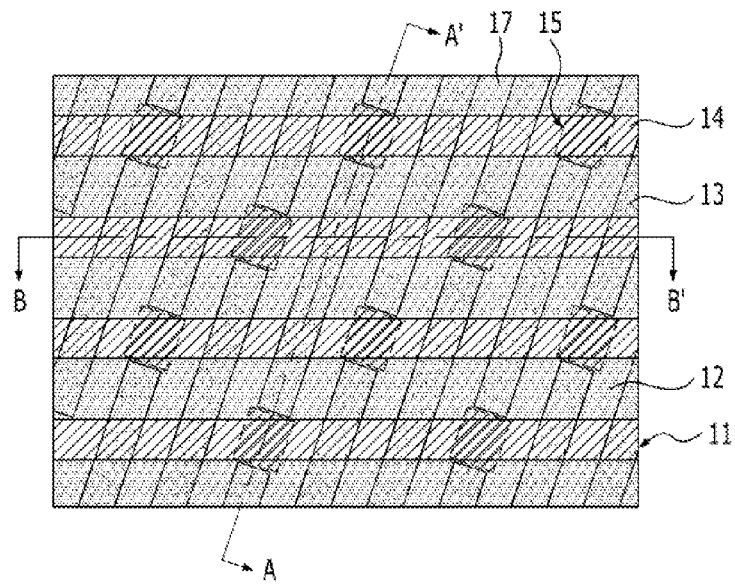
Figure 3C:
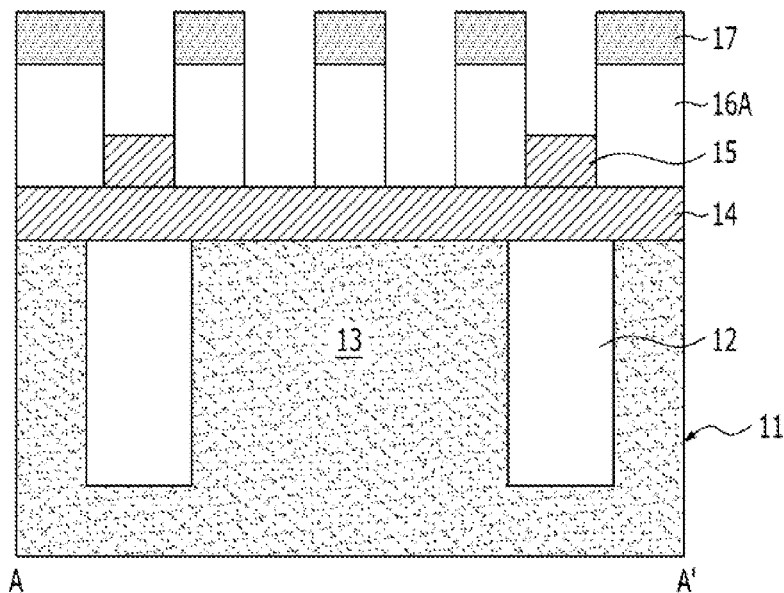
Figure 4C:
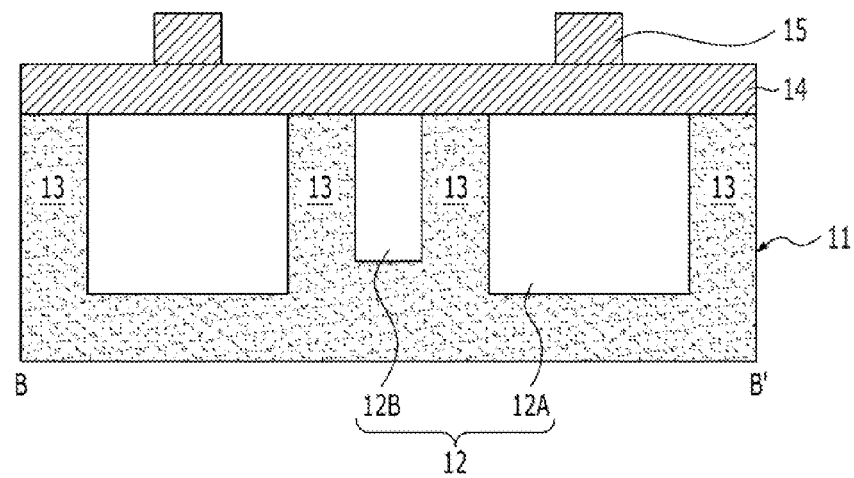

As shown in FIGS. 2C, 3C and 4C, a planarization pattern 16A is formed by etching the planarization layer 16 using the photoresist layer pattern 17.

In an etching process for forming the planarization layer pattern 16A, the second hard mask pattern 15 is exposed firstly by the height difference between the first hard mask layer 14 and the second hard mask layer 15, but remains without loss by the etching selectivity. That is, the first hard mask layer 14 and the second hard mask layer 15 work as an etching stop when the planarization layer pattern 16A is formed.

The planarization pattern 16A is patterned to define the buried gate region of the line type extended toward the short direction of the active region 13 as same as the photoresist layer pattern 17. Since a cross sectional view of FIG. 4C shows a buried gate region, the planarization layer 16 is etched, and the first hard mask layer 14 and the second hard mask layer 15 remain.

Figure 2D:
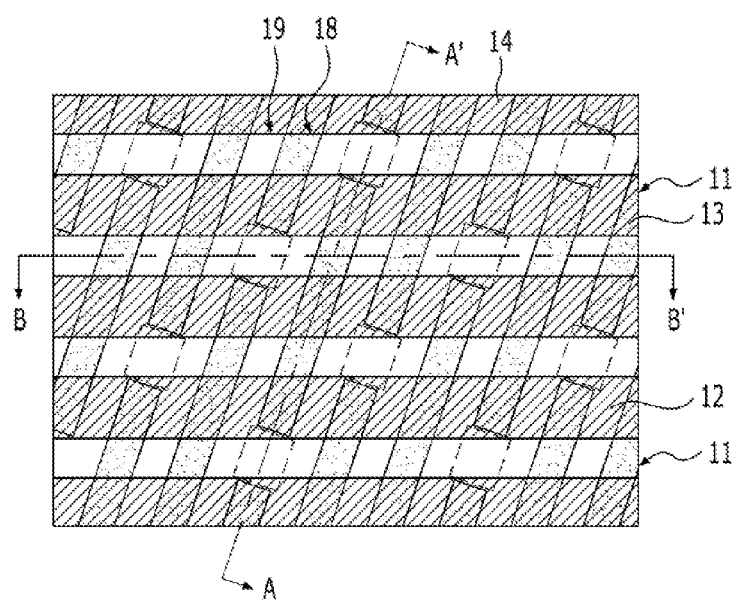
Figure 3D:
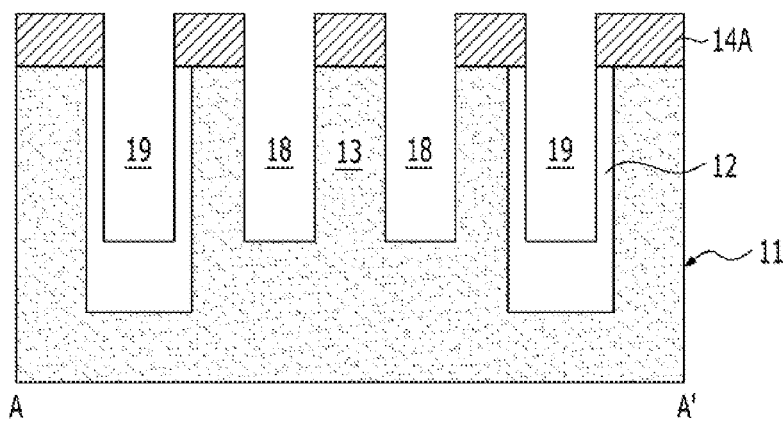
Figure 4D:
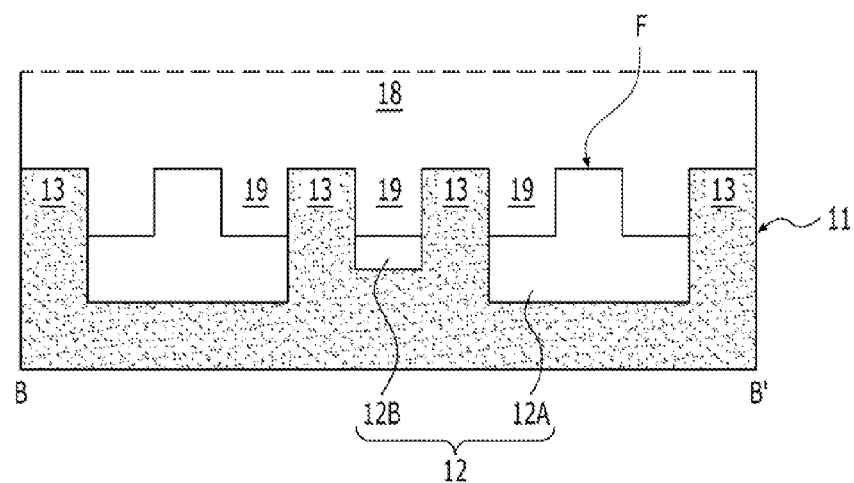

As shown in FIGS. 2D, 3D and 4D, first trenches 18 and second trenches 19 are formed by etching the substrate 11. The first and second trenches 18 and 19 provide a region where a buried gate is formed. As the first and second trenches 18 and 19 of a line type are formed to be extended toward the short axis direction of the active region, the first and second trenches 18 and 19 may be further formed on element isolation region. The first trench 18 of the active region may be formed to have a planarized surface, and the second trench 19 of the element isolation region 19 may be formed to have a fin F.

As shown in FIG. 3D, in a long axis direction of the active region 13, the second trench 19 of the element isolation region may be prevented from being formed thicker than the first trench 18 of the active region by locally forming the second hard mask pattern 15 on an upper portion of the element isolation region 12 having a faster etching speed than an etching speed of the substrate 11 in an etching process for forming the trenches 18 and 19.

As shown in FIG. 4D, the second trench 19 having the height difference by the second hard mask pattern 15 is formed on the buried gate region of the short direction of the active region 13. Herein, the second trench 19 has the fin F, which may be protrudedly formed higher than a bottom of the second trench 19. Moreover, an exposed region of the element isolation region 12 is adjusted by locally forming the second hard mask pattern 15, and an etch loading effect may be prevented by forming the fin F. Thus, the second trench 19 having a same depth irrespective of a line width.

Figure 2E:
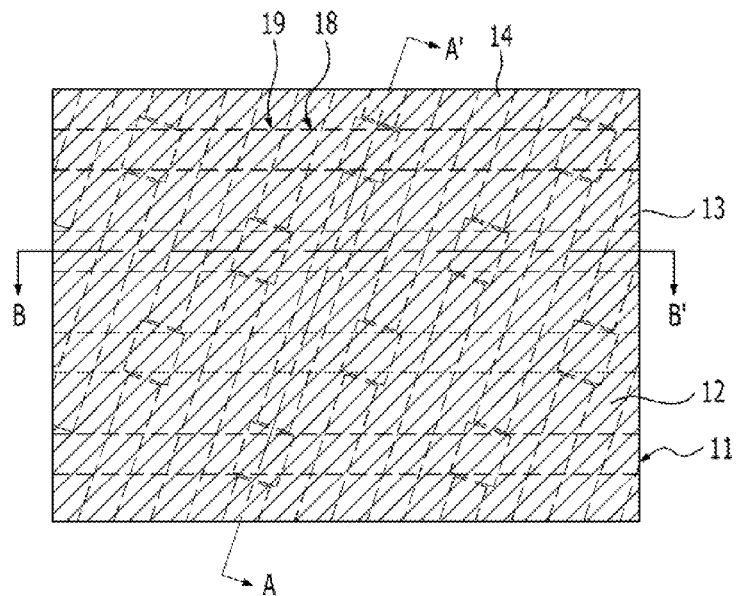
Figure 3E:
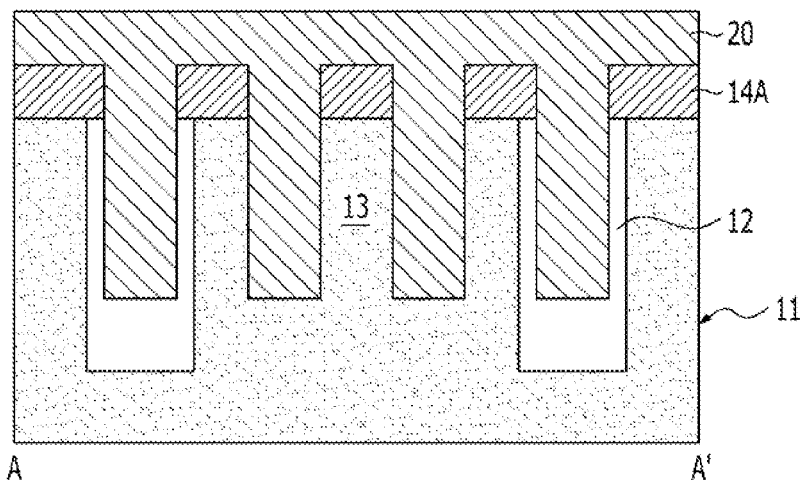
Figure 4E:
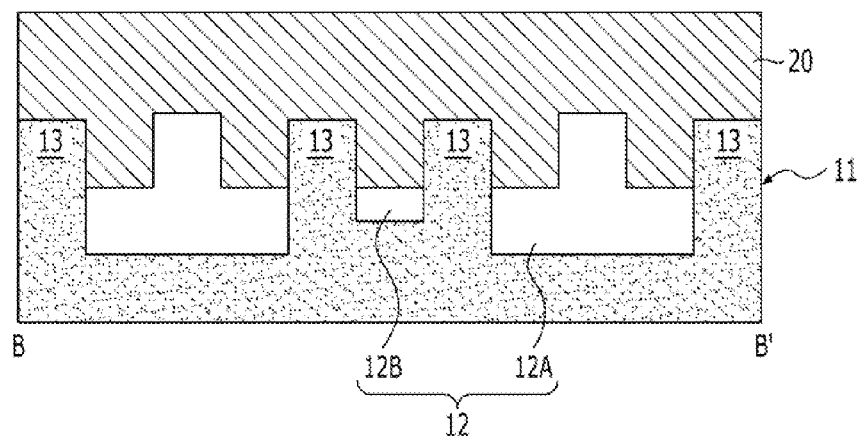

As shown in FIGS. 2E, 3E and 4E, a conductive material 20 is buried in the first and second trenches 18 and 19. A gate insulating layer (not shown) may be formed on a surface of the first and second trenches 18 and 19 before the conductive material 20 is formed. The conductive material 20 for forming the buried gate electrode may be formed with a metal containing layer. The metal containing layer may include titanium (Ti), tantalum (Ta), tungsten (W) or the like. The metal containing layer may include at least one selected from a group consisting of tantalum nitride (TaN), titanium nitride (TiN), tungsten nitride (WN) and tungsten (W).

For example, the conductive material 20 may include titanium nitride (TiN), tantalum nitride (TaN) or tungsten (W). The conductive material 20 may include a two-layer structure of TiN/W in which a tungsten (W) layer is stacked on a titanium nitride (TiN) layer or a two-layer structure of TaN/W in which a tungsten (W) layer is stacked on a tantalum nitride (TaN) layer. The conductive material 20 may include a two-layer structure of WN/W in which a tungsten (W) layer is stacked on a tungsten nitride (WN) layer, and may include a metal material having a low resistance.

Figure 2F:
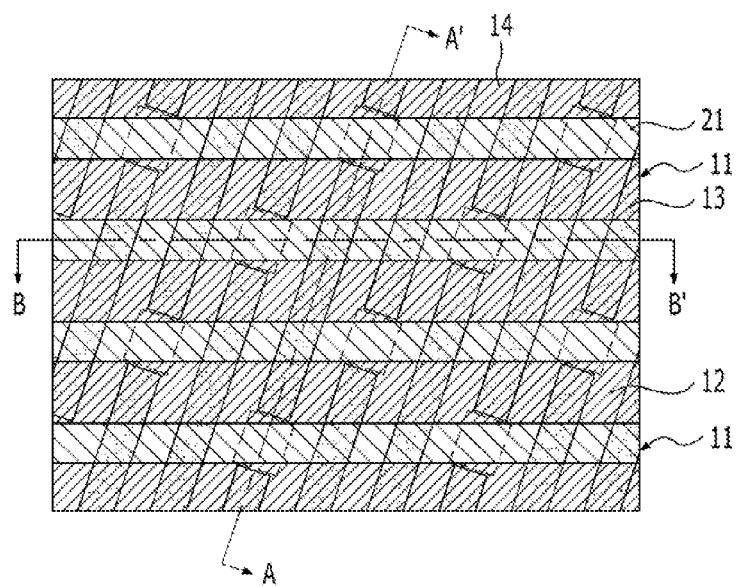
Figure 3F:
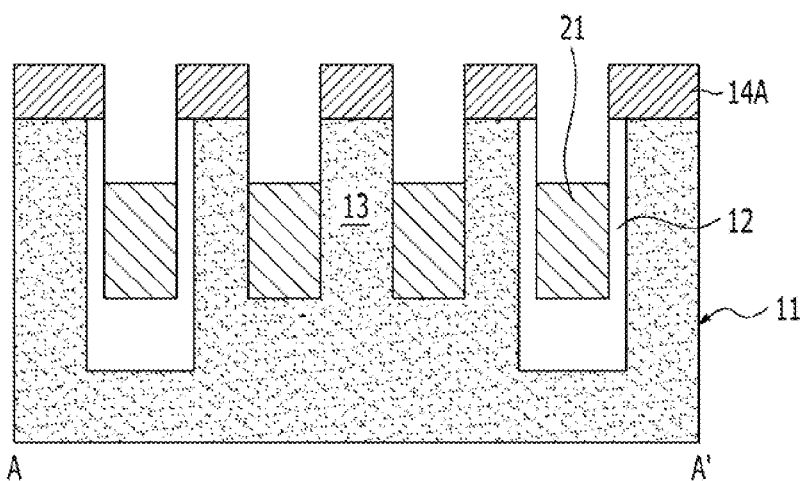
Figure 4F:
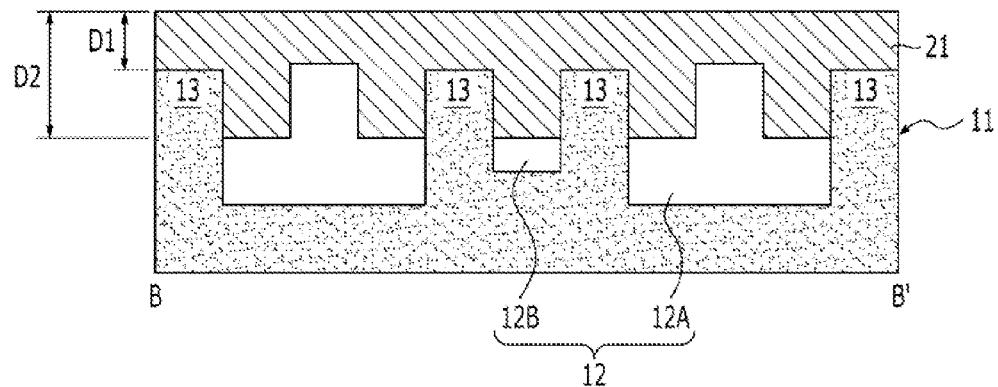

As shown in FIGS. 2F, 3F and 4F, a buried gate electrode 21 is formed by etching the conductive material 20. The etching for forming the buried gate electrode 21 may be performed through an etch back process.

The buried gate electrode 21 is recessed in the first trench 18 as shown in FIG. 3F. A surface of the buried gate electrode 21 has a lower height than a surface of the substrate 11. Meanwhile, as shown in FIG. 4F, an etching thickness may be adjusted to bury an entire surface of the second trench 19 having the fin F on the buried gate region. The buried gate electrode 21 may be formed to have a bottom plane of an uneven shape including a first region and a second region. The first region have a first thickness D1 by the active region 13 and the fin F, and the second region have a second thickness D2 thicker than the first thickness D1. That is, a buried thickness of the buried gate electrode 21 may be formed thinner than those of other regions due to the fin F that is protruded higher than a bottom plane of the second trench 19.

Thus, since an overlap of the buried gate electrode 21 with a neighboring cell may be reduced during a post-process as the buried thickness of the buried gate electrode 21 is reduced, a row hammering and a gate induced drain leakage (GIDL) may be improved.

During the post-process, a sealing layer (not shown) may be formed on the buried gate electrode 21. The sealing layer may gap-fill the first and second trenches 18 and 19 on the buried gate electrode 21. The sealing layer may perform an operation for protecting the buried gate electrode 21. The sealing layer may include an insulator material. The sealing layer may include a silicon nitride.

Figure 5:
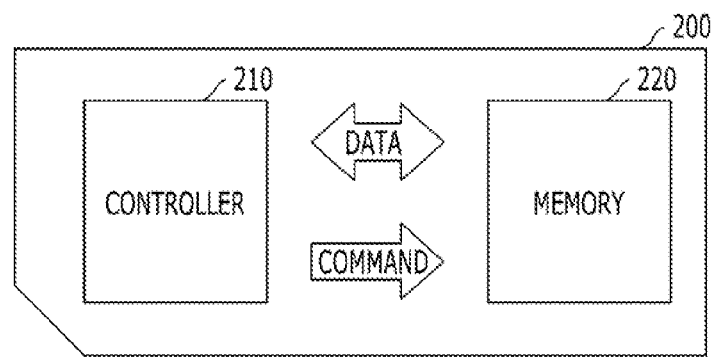
FIG. 5 is a block diagram illustrating a memory card.

FIG. 5 is a block diagram illustrating a memory card.

As shown in FIG. 5, a memory card 200 may include a controller 210 and a memory 220. The controller 210 and the memory 220 may exchange electrical signals. To be specific, the memory 220 and the controller 210 may exchange a data in response to a command of the controller 210. Thus, the memory card 200 may store the data in the memory 220 or output the data from the memory 220 to an external device. The memory 220 may include the semiconductor device having aforementioned patterns. The memory card 200 may be used as a data storage medium for diverse portable devices. For example, the memory card 200 may include a memory stick card, a smart media card (SM), a secure digital card (SD), a mini secure digital card (mini SD) or a multi media card (MMC).

Figure 6:
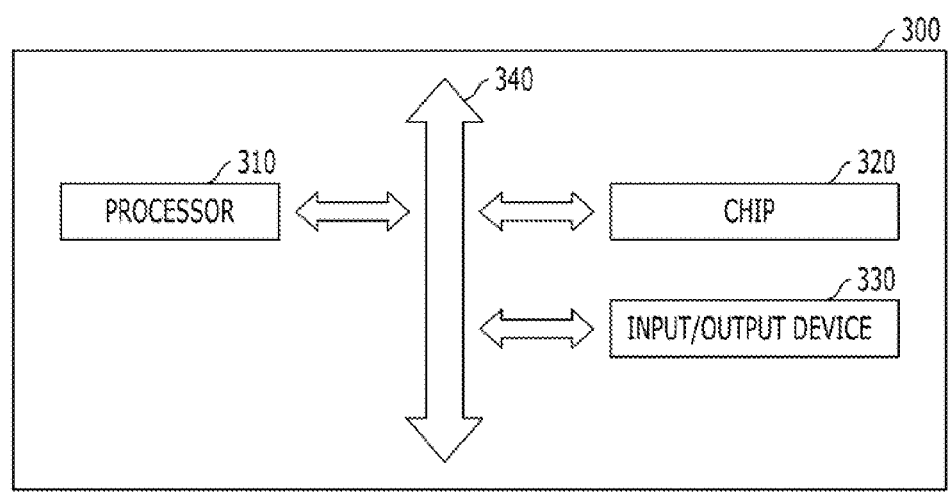
FIG. 6 is a block diagram illustrating an electronic system.

FIG. 6 is a block diagram illustrating an electronic system.

As shown in FIG. 6, the electronic system 300 may include a processor 310, an input/output device 330 and a chip 320, which perform a data communication through a bus 340. The processor 310 performs a program and controls the electronic system 300. The input/output device 330 may be used in inputting or outputting data to or from the electronic system 300. The electronic system 300 may be coupled to an external device, such as a personal computer or a network, and exchange data with the external device by using the input/output device 330. The chip 320 may store a code and data for the operation of the processor 310 and perform an operation applied by the processor 310. For example, the chip 320 may include the semiconductor device having aforementioned patterns. The electronic system 300 may include diverse electronic control devices having the chip 320. For example, the electronic system 500 may be used for mobile phones, MP3 players, navigators, solid-state disk (SSD), household appliances, or the like.

Embodiments of the present invention may reduce an overlap of a buried gate with a neighboring cell by forming a trench having a fin to form the buried gate. Thus, embodiments of the present invention may improve a row hammering and a GIDL.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a substrate including an element isolation region;
   a trench formed in the element isolation region;
   a gate electrode buried in the trench; and
   a plurality of active regions formed under the gate electrode,
   wherein the element isolation region has an upper surface and a bottom surface of a fin structure formed under the gate electrode between two adjacent active regions, and
   wherein the gate electrode includes a first region and a second region, the first region of the gate electrode is directly contacted to the upper surface of the fin structure included in the element isolation region, and the second region of the gate electrode is directly contacted to the bottom surface of the fin structure included in the element isolation region.

2. The semiconductor device of claim 1, wherein the upper surface of the fin structure is higher than a bottom surface of the trench.

3. The semiconductor device of claim 1, wherein the fin structure includes an insulating material.

4. The semiconductor device of claim 1, wherein the first region has a first thickness and the second region has a second thickness thicker than the first thickness.

5. A semiconductor device, comprising:
   a substrate having an element isolation region;
   a trench formed in the element isolation region;
   a gate electrode buried in the trench; and
   a plurality of active regions formed under the gate electrode,
   wherein the element isolation region is formed on the gate electrode and includes a fin structure formed under the gate electrode between two adjacent active regions, and
   wherein the gate electrode includes a first region and a second region, the first region of the gate electrode is directly contacted to an upper surface of the fin structure included in the element isolation region, and the second region of the gate electrode is directly contacted to a bottom surface of the fin structure included in the element isolation region.

6. The semiconductor device of claim 5, wherein the upper surface of the fin structure is higher than a bottom surface of the trench.

7. The semiconductor device of claim 5, wherein the first region has a first thickness and the second region has a second thickness thicker than the first thickness.

8. The semiconductor device of claim 5, wherein the gate electrode includes a metal.

9. The semiconductor device of claim 5, wherein each of the active regions has a bar shape having a long axis and a short axis, and ends of the long axis of neighboring active regions are adjacent to each other.

10. A semiconductor device, comprising:
    a substrate having an element isolation region;
    a first trench formed in the element isolation region;
    a first gate electrode buried in the first trench;
    a plurality of active regions formed under the first gate electrode;
    a second trench formed in the element isolation region and in parallel to the first trench; and
    a second gate electrode buried in the second trench, wherein the element isolation region is formed under the first gate electrode between two adjacent active regions and includes a fin structure formed protrudedly on a bottom surface of the first trench, and wherein the first gate electrode includes a first region and a second region, the first region is disposed over an upper surface of the fin structure included in the element isolation region, and the second region is disposed over a bottom surface of the fin structure included in the element isolation region.

11. The semiconductor device of claim 10, wherein the first region of the first gate electrode has a first thickness and the second region of the first gate electrode has a second thickness thicker than the first thickness.

12. The semiconductor device of claim 10, wherein the gate electrode includes a metal.

13. The semiconductor device of claim 10, wherein each of the active regions has a bar shape having a long axis and a short axis, and ends of the long axis of neighboring active regions are adjacent to each other.

14. A semiconductor device, comprising:
a substrate having an element isolation region and an active region defined by the element isolation region;
trenches formed in the active region and the element isolation region; and
a gate electrode buried in the trenches, wherein the trenches have a same depth in the active region and the element isolation region, and wherein the element isolation region have a fin structure formed under the gate electrode between two adjacent active regions, and wherein the gate electrode includes a first region and a second region, the first region of the gate electrode is directly contacted to an upper surface of the fin structure included in the element isolation region, and the second region of the gate electrode is directly contacted to a bottom surface of the fin structure included in the element isolation region.

15. The semiconductor device of claim 14, wherein the bottom surface of the fin structure is formed on a bottom surface of the trench in the element isolation region, and wherein the upper surface of the fin structure extends protrudedly from the bottom surface of the fin structure.

* * * * *